United States Patent

Wille et al.

[11] Patent Number: 5,821,456
[45] Date of Patent: Oct. 13, 1998

[54] MICROELECTRONIC ASSEMBLY INCLUDING A DECOMPOSABLE ENCAPSULANT, AND METHOD FOR FORMING AND REWORKING SAME

[75] Inventors: Steven Lewis Wille; Daniel Roman Gamota, both of Palatine; Colleen Mary Walsh, Roselle, all of Ill.

[73] Assignee: Motorola, Inc., Schaumburg, Ill.

[21] Appl. No.: 641,394

[22] Filed: May 1, 1996

[51] Int. Cl.⁶ .................................................. H01L 23/28
[52] U.S. Cl. .................... 174/52.2; 174/52.4; 361/760; 525/403
[58] Field of Search ..................... 525/523, 403; 427/96, 373; 174/52.2, 52.3, 52.4; 361/771, 760; 29/841; 437/250

[56] References Cited

U.S. PATENT DOCUMENTS 4,604,644  8/1986  Beckham et al. .
5,120,678  6/1992  Moore et al. .

OTHER PUBLICATIONS

"Repairability of Underfill Encapsulated Flip–Chip Packages", 45th Electronic Componenets & Technology Conference, May 21–24, 1995.
3M, "GAP–5527 Polyol Brochure", Issued Jun. 1994.
Hawley's Condensed Chemical Dictionary, 1993, p. 108.

*Primary Examiner*—Jeffrey Smith
*Assistant Examiner*—D. Aylward
*Attorney, Agent, or Firm*—Douglas D. Fekete; John B. MacIntyre

[57] ABSTRACT

A microelectronic assembly (10) includes an integrated circuit component (14) spaced apart from a substrate (12) by a gap filled with a polymeric encapsulant (18). The polymeric encapsulant (18) contains a thermally decomposable azide group. In the event that it is necessary to remove the component (14), such as if the component (14) is found to be defective, the microelectronic assembly (10) is heated to a temperature above the decomposition temperature of the azide group. Decomposition of the azide group disintegrates the encapsulant (18) and preferably detaches the component from the substrate (12), thereby permitting replacement of the component (14).

5 Claims, 1 Drawing Sheet

MICROELECTRONIC ASSEMBLY INCLUDING A DECOMPOSABLE ENCAPSULANT, AND METHOD FOR FORMING AND REWORKING SAME

FIELD OF THE INVENTION

This invention relates generally to a microelectronic assembly in which an integrated circuit component is spaced apart from a substrate by a gap that is filled with an encapsulant. More particularly, this invention relates to such a microelectronic assembly wherein the encapsulant contains a thermally decomposable azide group to facilitate removal of the integrated circuit component.

BACKGROUND OF THE INVENTION

It is known to directly attach solder bumps on integrated circuit components to bond pads on a printed circuit board or other suitable substrate to form solder bump interconnections. A gap is formed between the integrated circuit component and the printed circuit board. The solder bump interconnections extend across the gap to physically attach the component to the board and to electrically connect an electrical circuit on the component to an electrical circuit on the substrate. Solder bump interconnections are susceptible to corrosion and to cracking caused by thermally induced stresses. The gap is filled with a polymeric encapsulant material to encapsulate and strengthen the solder joints without affecting the electrical connection.

In the event that an assembly needs repair, it may be necessary to remove and replace the component. The component may be removed by grinding to expose the encapsulant and the solder bump interconnections on the board. A replacement integrated circuit component is then placed onto the printed circuit board and reflowed to connect the solder bumps. After reflow, the replacement component is underfilled with additional encapsulant that is subsequently cured. The additional encapsulant increases the distance of the component from the substrate and decreases clearances between the component and a housing holding the assembly, thereby degrading the reliability of the assembly. Further, residue on the board from grinding may reduce adhesion of the additional encapsulant. Further, grinding can damage other components on the board, such as oscillators that are sensitive to high frequency vibrations.

Another method proposed to remove a defective integrated circuit component from a printed circuit board requires immersion of the printed circuit board into a heated solvent bath to dissolve the encapsulant. After the encapsulant is removed, the microelectronic assembly is heated to a temperature sufficient to reflow the solder bump interconnections, which allows the component to be removed from the printed circuit board. However, the heated solvent bath may adversely affect other polymeric material on the printed circuit board, requiring additional repair of other components.

Therefore, a need exists for a microelectronic assembly that comprises an integrated circuit component that is underfilled with an encapsulant that is readily removable to permit removal of a defective component and to provide a clean site for attaching a replacement component. It is desired to provide a single operation that removes the component and the encapsulant. Further, there is a need for an encapsulant that allows a single component to be replaced without damaging or affecting other components or encapsulant on the substrate.

DETAILED DESCRIPTION OF A PREFERRED EMBODIMENT

Figure 1:
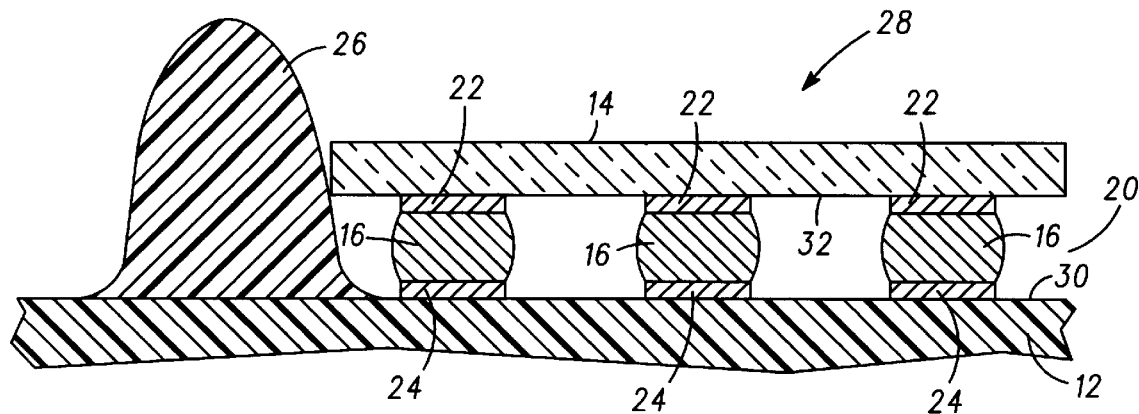
FIG. 1 is a cross-sectional view of a microelectronic assembly prior to underfilling with a thermally decomposable encapsulant precursor in accordance with a preferred embodiment of the present invention.

In accordance with a preferred embodiment of the present invention, FIG. 1 shows a microelectronic preassembly 28 after attachment of an integrated circuit component 14 to a substrate 12. In this embodiment, component 14 is an integrated circuit die adapted for mounting on a printed circuit board by a flip-chip process. Alternately, the integrated circuit component may be a ball grid array package wherein an integrated circuit chip is mounted on a carrier that is subsequently mounted on a printed circuit board by solder bump interconnections. Component 14 includes a face 32 comprising component bond pads 22. Component bond pads 22 are disposed on face 32 and are preferably composed of solder-wettable copper and carry solder bumps. The solder bumps are preferably formed of a tin-lead solder. A preferred solder bump comprises about 97 weight percent lead and the balance substantially tin.

Substrate 12 is preferably a printed circuit board formed of a polymer layer laminated onto a ceramic or polymer/glass mesh core, commonly referred to as an FR4 board. Substrate bond pads 24 are disposed about a die attach region 30 and are preferably composed of solder-wettable copper that is coated with a solder layer composed of eutectic tin-lead solder being formed of 63 weight percent tin and the balance substantially lead and having a liquidus temperature of about 183° C. In preparation for bonding, integrated circuit component 14 is mounted onto substrate 12 such that each of the solder bumps on component bond pads 22 registers with a corresponding substrate bond pad 24. Microelectronic preassembly 28 is heated to a temperature sufficient to reflow the solder layer to bond component bond pads 22 to substrate bond pads 24 and form solder bump interconnections 16. In a preferred embodiment, microelectronic preassembly 28 is reflowed at a temperature above 183° C., the reflow temperature of the solder layer, and less than 220° C. Gap 20 is formed between face 32 and substrate 12 upon attachment of integrated circuit component 14 to substrate 12, and solder bump interconnections 16 extend across gap 20.

After integrated circuit component 14 is attached to substrate 12, gap 20 is filled with a resinous encapsulant by dispensing a precursor 26 onto substrate 12. In accordance with a preferred embodiment of the present invention, precursor 26 is a flowable mixture that is formulated to produce an epoxy resin that includes a thermally decomposable azide group. A preferred precursor formulation comprises:

| | |
|---|---|
| epoxy prepolymer | 10–20% |
| triethyleneglycol diamine | 3–7% |
| glycidyl azide polymer | 0.5–4.0% |
| 2-phenylimidazole | 0.1–1.0% |

| | |
|---|---|
| aminosilane | 0.01–0.10% |
| inorganic particles | balance |

As used herein, percentages refer to weight percentages. Epoxy resin has strong adhesive properties and desirable resistance to chemical and thermal degradation. Epoxy prepolymer 26 includes epoxy end groups that react during curing to form the product resin. A preferred epoxy resin is the reaction product of a bisphenol-derivative epoxy-base prepolymer and an amine-terminated polyether compound and includes a glycidyl ether of bisphenol-F to enhance structural integrity and to improve the mechanical properties of the resultant encapsulant. A suitable prepolymer is available from the Union Carbide Corp. under the trade designation Bis-F 828.

The epoxy formulation preferably includes a hardener that reacts with the epoxy precursor to form the product resin. A suitable hardener is an amine-terminated polyether compound, preferably triethyleneglycol diamine sold under the trade name Jeffamine by Texaco, Inc. Other suitable hardeners include isocyanate compounds, melamine compounds, aziridine compounds, and anhydride compounds. The stoichiometric ratio of the epoxy resin to the hardener is preferably about 3:1.

A catalyst is added to promote reaction of the constituents during curing. A preferred catalyst is 2-phenylimidazole. Other suitable catalysts are amines, acids, and anhydrides.

The aminosilane is an adhesion promoter that enhances wetting of the substrate to promote adhesion of the resultant encapsulant. A preferred adhesion promoter is gamma-aminopropyltriethoxysilane. A preferred adhesion promoter is sold by Union Carbide Corp. under the trade designation A-1100. Other suitable adhesion promoters are fluoropolymers and silicones.

The inorganic particles act as a filler and preferably constitute between about 65 and 85 weight percent of the fully-reacted encapsulant and control the flow properties of the precursor. In a preferred embodiment, the inorganic particles are silica particles. Preferably the inorganic filler is added in an amount effective to adjust the coefficient of thermal expansion of the encapsulant to more closely correspond to the component and thereby enhance the reliability of the assembly. In a preferred embodiment, the filler is composed of fused silica particles of two sizes, a first having an average size of 6 microns and a second having an average size of 20 microns, the sizes being average agglomerate sizes as measured by conventional laser scattering techniques. Adding filler particles of different sizes enhances the flow properties of the precursor into the gap between the component and the substrate. Other suitable fillers are alumina, barytes, aluminum nitride, and other inorganic materials. In a preferred embodiment, the encapsulant is composed of less than about 25 weight percent epoxy-base resin and the balance filler.

In accordance with this invention, the formulation is a polymer matrix that includes a glycidyl azide compound to facilitate decomposition of the encapsulant in the event of rework of the assembly. A preferred glycidyl azide compound is an epoxy-base resin that includes the azide as a side chain. The azide is stable at normal operating temperatures but decomposes at temperatures above about 220° C., greater than the temperatures required for curing epoxy-base resins, typically less than about 150° C. A preferred compound is an azide diol; a glycidyl azide polymer, GAP diol L9961 in accordance with the following formula:

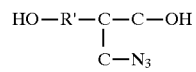

wherein R' is preferably an alkane chain comprising between one and four carbons. The hydroxyl end groups are provided for reaction with the epoxy end groups so that the glycidyl azide compound is incorporated into the product polymer. A preferred glycidyl azide polymer is sold under as a solution under the trade designation GAP diol L9961 by the Minnesota Mining and Manufacturing Company.

By way of an example of a specific formulation, a preferred precursor comprises:

| | |
|---|---|
| epoxy prepolymer | 15.0% |
| triethyleneglycol diamine | 5.0% |
| glycidyl azide polymer | 1.0% |
| 2-phenylimidazole | 0.5% |
| aminosilane | 0.05% |
| fused silica particles | 78.45% |

In a preferred embodiment, the epoxy prepolymer and the glycidyl azide compound are mixed and heated to about 150° C. for about one hour to react the end groups to form a prepolymer in which the glycidyl azide compound is incorporated. The mixture is then cooled to about 40° C. The triethyleneglycol diamine, 2-phenylimidazole, and aminosilane are added to the mixture while stirring. The mixture is further stirred for about 30 minutes. The fused silica particles are sifted into the mixture until the mixture is thoroughly blended to form a homogenous mixture. The prepolymer can then be packaged and frozen to about −40° C. for extended storage.

Precursor 26 is dispensed proximate to die attach region adjacent to integrated circuit component 14 and is drawn into gap 20 by capillary action. Precursor 26 is preferably deposited on two adjacent sides of integrated circuit component 14 using a syringe or the like. In a preferred embodiment, assembly 10 is heated to a temperature of about 75° C. prior to the dispensing of precursor 26. This preheating reduces the viscosity and enhances the flow of precursor 26 into gap 20.

Figure 2:
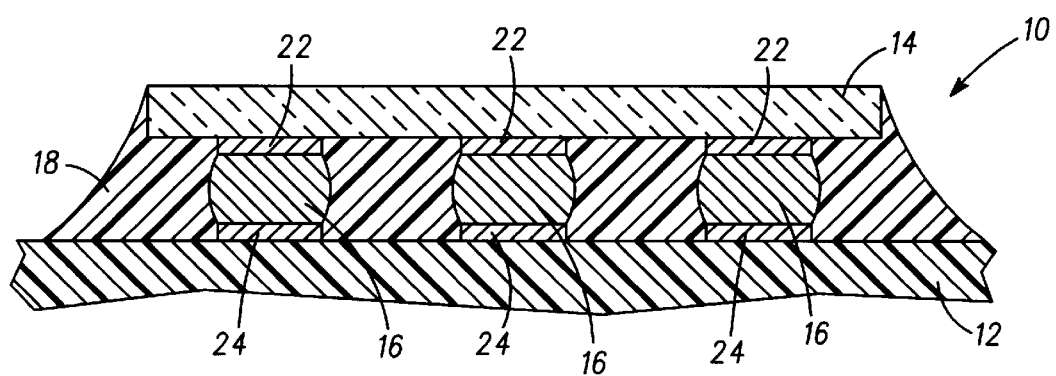
FIG. 2 is a cross-sectional view of the microelectronic assembly of FIG. 1 subsequent to underfilling and curing in accordance with a preferred embodiment of the present invention.

After gap 20 has been filled with precursor 26, precursor 26 is cured by heating assembly 10 to a temperature sufficient to react the bisphenol-derivative epoxy-base prepolymer and the amine-terminated polyether compound. The curing is carried out at a temperature less than the reflow temperature of solder bump interconnections 16, preferably between about 100° and 150° C. for the preferred epoxy formulation, to form encapsulant 18 in FIG. 2. The azide-containing epoxy reacts with diamine, which reaction is catalyzed by the imidazole, to form a gelled epoxy polymer encapsulant that is stable at temperatures up to about 220° C. Encapsulant 18 is a polymer matrix and includes an inorganic filler dispersed in the polymer matrix.

Thus, product assembly 10 comprises integrated circuit component 14 attached to substrate 12 and spaced apart therefrom by gap 20. Solder bump interconnections 16 extend across gap 20 and connect integrated circuit component 14 and substrate 12. Gap 20 is filled with encapsulant 18, which is composed of a thermoset resin and contains a thermally decomposable azide group. Furthermore, in the preferred embodiment, the resin is an epoxy-base resin that is a reaction product of a glycidyl azide-substituted epoxy-base prepolymer and an amine-terminated polyether compound. In this manner, the azide group is incorporated into the polymer matrix. Encapsulant 18 surrounds solder bump interconnections 16 and improves the reliability of integrated circuit component 14 mounted on substrate 12 by protecting solder bump interconnections 16 from exposure to environmental damage and providing enhanced mechanical support for interconnections 16.

Figure 3:
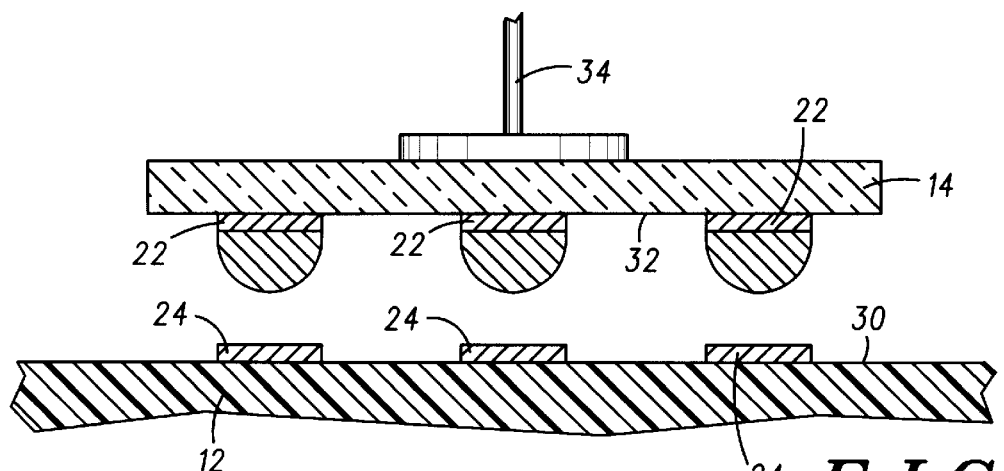
FIG. 3 is a cross-sectional view of a microelectronic assembly after thermal decomposition of the encapsulant in accordance with a preferred embodiment of the present invention.

When integrated circuit component 14 is desired to be removed from substrate 12, for instance if component 14 is found to be defective, the assembly is heated to a temperature sufficient to decompose the azide group in encapsulant 18. Referring to FIG. 3, in accordance with a preferred embodiment of the present invention, the assembly is heated to a rework temperature between about 220° C. and about 250° C., preferably about 240° C. The rework temperature should be higher than the reflow temperature of the solder bump interconnections. In this manner, the solder bump interconnections will liquefy prior to decomposition of the encapsulant, such that when the encapsulant degrades, the solder bump interconnections will be liquidus and will facilitate removal of the component from the substrate. The rework temperature is preferably 50°–100° C. lower than the decomposition temperature of substrate 12 to prevent substrate 12 from damage that could lead to structural or reliability problems. Alternately, local heating, such as forced air or soft-beam heating, can be employed to heat only the component area, thereby minimizing heating of other areas of the assembly.

Upon heating the assembly to the desired rework temperature, the thermally decomposable azide group dissociates to form nitrogen gas. This disposed nitrogen gas stresses the polymer matrix and disintegrates the encapsulant into a fine powder. Concurrently, the component is preferably popped off the substrate. This is facilitated by heating the solder bump interconnections above their reflow temperature. The powder is easily removed from the surface of substrate 12, such as by air-blowing or a solvent wash.

By reworking the assembly at a temperature greater than 183° C., the solder bump interconnections attaching component bond pads 22 to substrate bond pads 24 are reflowed. An end effector 34 engages component 14 and detaches component 14 from substrate 12, which cleanly removes component 14 from substrate 12. This provides a clean site for attaching a replacement component. By reworking only the defective component site, other components attached to the substrate are not adversely affected.

Thus, this invention provides a reworkable encapsulant that disintegrates to facilitate removal of an integrated circuit component for repair of the microelectronic assembly. The encapsulant disintegrates to leave a residue that is easily cleaned from the surface of the substrate to provide a clean site for attachment of a replacement component. Since the encapsulant is removed from the substrate, the height of the replacement component is comparable to the original component. Moreover, during normal operation, the present invention provides a stable encapsulant that protects the solder bump interconnections. By incorporating the glycidyl azide compound into backbone of the polymer, the azide compound remains dispersed and is prevented from separating into undesirable concentrations.

While this invention has been disclosed in terms of an epoxy encapsulant containing glycidyl azide, the encapsulant may be suitably formed of other suitable thermoset resins including polyesters, polyethers, acetates, urethanes, and acrylics. Alternately, the glycidyl azide may be added to a thermoplastic resin. While the glycidyl azide is preferably added to the backbone in order to become a part of the polymer in order to disperse it throughout the encapsulant to increase distribution, it can be added as a filler or additive that does not react with the polymer.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
   a printed circuit board;
   an integrated circuit component overlying the printed circuit board and spaced apart by a gap;
   a plurality of solder bump interconnections extending across the gap and connecting the integrated circuit component and the printed circuit board; and
   an encapsulant within the gap about the solder bump interconnections and composed predominantly of a mixture of an epoxy-base polymer matrix and an inorganic filler, said encapsulant containing an azide group.

2. A microelectronic assembly in accordance with claim 1, wherein the epoxy-base polymer matrix comprises the glycidyl azide group.

3. A microelectronic assembly in accordance with claim 1, wherein the solder bump interconnections are formed of a solder having a reflow temperature, and wherein the glycidyl azide group decomposes at a temperature greater than the reflow temperature of the solder bump interconnections.

4. A microelectronic assembly in accordance with claim 1, wherein the epoxy-base polymer matrix is a reaction product of an azide-substituted epoxy-base prepolymer and an amine-terminated polyether compound.

5. A microelectronic assembly in accordance with claim 1, wherein the encapsulant is composed of less than about 25 weight percent epoxy-base resin.

* * * * *